US007253501B2

(12) United States Patent
Lee et al.

(10) Patent No.: US 7,253,501 B2
(45) Date of Patent: Aug. 7, 2007

(54) HIGH PERFORMANCE METALLIZATION CAP LAYER

(75) Inventors: Hsien-Ming Lee, Changhua (TW); Jing-Cheng Lin, HsinChu County (TW); Shing-Chyang Pan, Hsinchu County (TW); Ching-Hua Hsieh, Hsinchu (TW); Chao-Hsien Peng, Hsinchu (TW); Cheng-Lin Huang, Hsinchu (TW); Li-Lin Su, Taichung County (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 13 days.

(21) Appl. No.: 10/909,980

(22) Filed: Aug. 3, 2004

(65) Prior Publication Data

US 2006/0027922 A1 Feb. 9, 2006

(51) Int. Cl.
*H01L 23/58* (2006.01)
*H01L 23/48* (2006.01)
*H01L 23/52* (2006.01)
*H01L 29/40* (2006.01)

(52) U.S. Cl. .................. 257/639; 257/640; 257/758; 257/760; 257/761; 257/763; 257/764; 257/765; 257/766; 257/E23.011

(58) Field of Classification Search .......... 257/637, 257/639, 640, 758, 760, 761, 763, 764, 765, 257/766, E23.011
See application file for complete search history.

(56) References Cited

U.S. PATENT DOCUMENTS 6,680,500 B1 1/2004 Low et al.
6,690,091 B1 2/2004 Chooi et al.
6,709,874 B2 3/2004 Ning
6,727,588 B1 4/2004 Abdelgadir et al.
6,783,694 B1* 8/2004 Lee et al. ................. 252/79.1
2003/0027393 A1* 2/2003 Suguro ....................... 438/287
2005/0202664 A1* 9/2005 Jawarani .................... 438/592

OTHER PUBLICATIONS

Hu, C.-K., et al., "Comparison of Cu Electromigration Lifetime in Cu Interconnects Coated with Various Caps," Applied Physics Letters, Aug. 4, 2003, pp. 869-871, vol. 83, No. 5, American Institute of Physics, College Park, MD, USA.
Ko, T. et al., "High Performance/ Reliability Cu Interconnect with Selective CoWP Cap," 2003 Symposium on VLSI Technology Digest of Papers, 2003.
Tu, K.N., "Recent Advances on Electromigration in Very-Large-Scale-Integration of Interconnects," Journal of Applied Physics, Nov. 1, 2003, pp. 5451-5473, vol. 84, No. 9, American Institute of Physics, College Park, MD, USA.

* cited by examiner

*Primary Examiner*—Ngân V. Ngô
(74) *Attorney, Agent, or Firm*—Slater & Matsil, L.L.P.

(57) ABSTRACT

A semiconductor device having a nonconductive cap layer comprising a first metal element. The nonconductive cap layer comprises a first metal nitride, a first metal oxide, or a first metal oxynitride over conductive lines and an insulating material between the conductive lines. An interface region may be formed over the top surface of the conductive lines, the interface region including the metal element of the cap layer. The cap layer prevents the conductive material in the conductive lines from migrating or diffusing into adjacent subsequently formed insulating material layers. The cap layer may also function as an etch stop layer.

13 Claims, 8 Drawing Sheets

HIGH PERFORMANCE METALLIZATION CAP LAYER

TECHNICAL FIELD

The present invention relates generally to the fabrication of semiconductor devices, and more particularly to the formation of a cap layer over conductive lines of a semiconductor device.

BACKGROUND

Semiconductor devices are used in many electronic applications. Semiconductor devices are manufactured by depositing, patterning, and etching one or more conductive, insulating, and semiconductive layers on a semiconductor workpiece or wafer. Semiconductor devices may comprise analog or digital circuits, memory devices, logic circuits, peripheral support devices, or combinations thereof, formed on an integrated circuit (IC) die, as examples.

The trend in the semiconductor industry is towards the miniaturization or scaling of integrated circuits, in order to provide smaller ICs and improve performance, such as increased speed and decreased power consumption. While aluminum and aluminum alloys were most frequently used in the past for the material of conductive lines in integrated circuits, the trend is now towards the use of copper for a conductive line material because of its benefits of decreased resistance, higher conductivity and higher melting point, as examples. Another change in materials used for semiconductor device manufacturing is a trend away from the use of silicon dioxide for the insulating material between conductive lines and towards the use of low dielectric constant materials, which typically have a dielectric constant (k) less than the dielectric constant of silicon dioxide, which is about 4.0 to 4.5.

The change in the conductive line material and insulating materials of semiconductor devices has introduced new challenges in the manufacturing process. For example, copper oxidizes easily and has a tendency to diffuse into adjacent insulating materials, particularly when a low dielectric constant material or other porous insulator is used for an inter-level dielectric (ILD) material.

To prevent the diffusion of copper and other metals from migrating and poisoning the adjacent insulating layers, barrier layers or cap layers are often used in an attempt to prevent this diffusion. For example, $SiN_x$, $SiC_xN_yH_z$, and a bilayer of Ta/TaN having the same pattern as underlying conductive lines, have been used as etch stop layers and diffusion barriers, as described in "Comparison of Cu Electromigration Lifetime in Cu Interconnects Coated With Various Caps" in the Aug. 4, 2003 issue of Applied Physics Letters by Hu et al., which is incorporated herein by reference. Other proposed solutions are to provide a metal cap layer having the same pattern as underlying recessed conductive lines, wherein the metal cap layer comprises W, Ti, TiN, Ta, TaN, TiW, Al, CoWP, or CoP, as described in U.S. Pat. No. 6,709,874 issued to Ning on Mar. 23, 2004, which is incorporated herein by reference. In U.S. Pat. No. 6,680,500 issued to Low et al. on Jan. 20, 2004, also incorporated herein by reference, insulating cap layers comprised of SiN, and $SiO_2$ are also proposed. The selective formation of CoWP over conductive lines is described in an article in the 2003 Symposium on VLSI Technology Digest of Technical Papers entitled "High Performance/reliability Cu Interconnect with Selective CoWP Cap," by Ko et al., also incorporated herein by reference.

What is needed in the art is an improved method of preventing surface migration and diffusion of conductive line material into adjacent insulating materials.

SUMMARY OF THE INVENTION

These and other problems are generally solved or circumvented, and technical advantages are generally achieved by preferred embodiments of the present invention, which provide a cap layer that is deposited as a blanket layer over conductive lines and the insulating layer that the conductive lines are formed in. The cap layer is non-conductive and comprises a metal element in a non-conductive or insulating state, such as an oxide of a metal element, a nitride of a metal element, an oxynitride of a metal element, or combinations thereof. An interface region may be formed within the cap layer over and abutting conductive lines over which the cap layer is formed.

In accordance with a preferred embodiment of the present invention, a semiconductor device includes a workpiece, a first insulating layer over the workpiece, at least one first conductive line in the first insulating layer, and a first cap layer over the first insulating layer and the at least one first conductive line. The first cap layer is nonconductive and comprises at least a first metal element.

In accordance with another preferred embodiment of the present invention, a semiconductor device includes a workpiece, a first insulating layer over the workpiece, at least one first conductive line formed in the first insulating layer, and a first cap layer over the first insulating layer and the at least one first conductive line. The first cap layer comprises $MO_xN_y$, wherein M comprises at least a first metal element.

In accordance with yet another preferred embodiment of the present invention, a method of manufacturing a semiconductor device includes providing a workpiece, forming a first insulating layer over the workpiece, forming at least one first conductive line in the first insulating layer, and forming a first cap layer over the first insulating layer and the at least one first conductive line. Forming the first cap layer comprises forming a nonconductive material comprised of a first metal.

Advantages of preferred embodiments of the present invention include providing a cap layer that suppresses the surface diffusion of copper and other metals used for conductive lines of a semiconductor device. The cap layer formation is easily implemented into current manufacturing process flows, and results in high performance and high yield integrated circuit devices. The cap layer described herein results in the manufacturing of a robust damascene conductive line structure having improved reliability. The cap layer functions as a barrier layer to prevent diffusion of the metal from conductive lines into adjacent insulating material layers, and it also functions as an etch stop layer for damascene processes, for example. The cap layers described herein provide increased electromigration resistance for the conductive lines. The optional interface region of the cap layer on an underlying conductive line may be conductive or non-conductive, and provides increased robustness for the structure by improving the adhesion of the cap layer to an underlying conductive line.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Prior art cap layers for conductive lines have weak points at the interface of the conductive line to the cap layer, which causes reliability issues. Failure analysis has shown that prior art cap layers such as $SiC_xH_yN_z$, for example, serve as a weak surface diffusion path and have a lower activation energy than the lattice and grain boundary diffusion paths.

The effective activation energy of copper interconnect electromigration has been found to be very close to a surface diffusion energy for copper. The surface diffusion path of copper has been found to be more critical and have a more dominant effect on reliability than the lattice or grain boundary diffusion path of copper, due to damascene process characteristics, both at high temperature (e.g., 250° to 350° C.) accelerated tests, and more particularly at typical semiconductor device operation temperatures of about 100° C.

As semiconductor devices are scaled to smaller and smaller feature sizes, the number of layers of copper dama- scene interconnects will continue to be increased. For example, 10 or more layers of copper interconnects may be used in semiconductor device designs. Prior art cap layers having weak surface diffusion paths have a tendency to induce voiding at the cap layer interface after the device is subjected to stress, creating reliability issues for semiconductor devices.

Embodiments of the present invention provide robust copper reliability and chip manufacturing processes by suppressing the surface diffusion path and achieving high performance and high yield integrated circuit products. Preferred embodiments of the present invention will next be described in a single damascene process flow, a subtractive etch process flow and a dual damascene process flow, followed by a discussion of some experimental test results.

Figure 1:
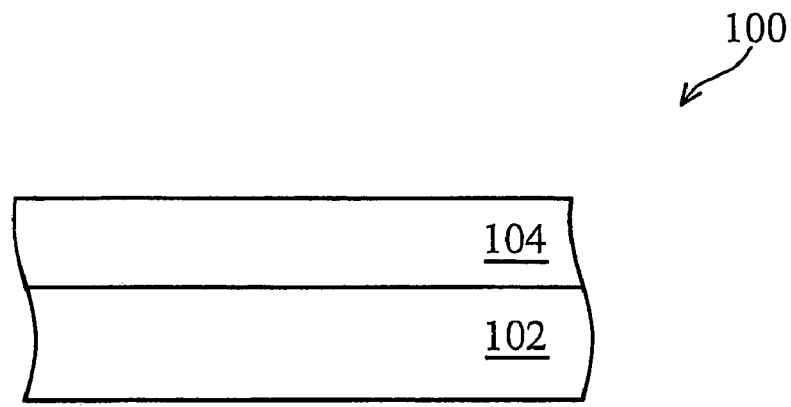
FIGS. 1 through 3 and 4a, 4b, and 4c show cross-sectional views of a cap layer according to a preferred embodiment of the present invention incorporated into a single damascene manufacturing process for forming conductive lines.

FIGS. 1 through 3 and FIGS. 4a, 4b, and 4c show cross-sectional views of a preferred embodiment of the present invention, incorporated in a single damascene manufacturing process. Referring first to FIG. 1, a workpiece 102 is provided. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g. transistors, diodes, etc. Compound semiconductors, GaAs, InP, Si/Ge, or SiC, as examples, may be used in place of silicon.

A first insulating layer 104 is formed over the workpiece 102. The first insulating layer 104 may comprise traditional dielectric materials such as silicon oxide or dioxide, which has a dielectric constant of about 4.0. Alternatively, and more preferably, the first insulating layer 104 may comprise low dielectric constant materials, having a dielectric constant (k) of less than about 4.0 (or the dielectric constant of silicon dioxide), for example. The low k material may comprise diamond-like carbon, such as Black Diamond™ by Applied Materials, Inc., fluorinated silicate glass or fluorinated silicon oxide glass (FSG), $SiO_xC_y$, Spin-On-Glass, Spin-On-Polymers, SILK™ by Dow Chemical, Orion™ by Trikon Technologies, Inc., FLARE™ by Honeywell, LKD (low k dielectric) from JSR Micro, Inc., silicon carbon material, compounds thereof, composites thereof, and/or combinations thereof, as examples. The first insulating layer 104 may alternatively comprise a combination of one or more low k materials or silicon oxide, for example. The first insulating layer 104 preferably comprises a thickness of about 3000 Angstroms, although the first insulating layer 104 may alternatively comprise other dimensions, for example.

Figure 2:
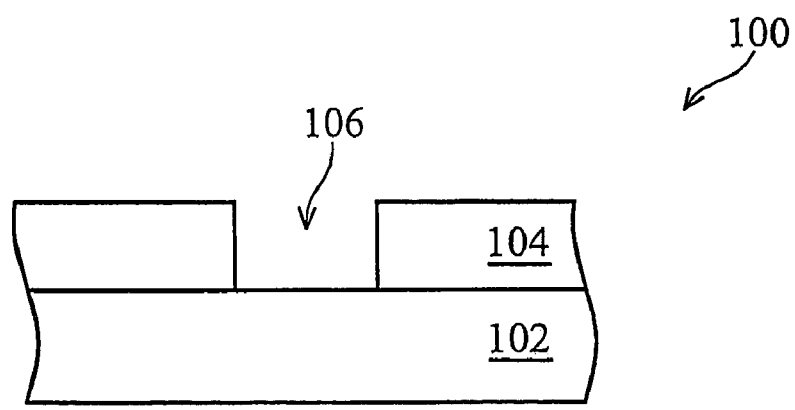

The first insulating layer 104 is patterned with a pattern 106 for at least one first conductive line, as shown in FIG. 2. The pattern 106 may comprise a long thin trench that is relatively straight, or that curves and digresses in bends or other patterns (not shown in FIG. 2), for example. The pattern 106 may alternatively comprise a hole for a via, for example.

The first insulating layer 104 may be patterned directly using electron beam lithography (EBL) or alternatively, the first insulating layer 104 may be patterned by depositing a photoresist, not shown, over the first insulating layer 104, patterning the photoresist using a lithography mask, also not shown, and using the photoresist as a mask while portions of the first insulating layer 104 are etched away. The photoresist is then removed from over the first insulating layer 104 using a strip process, for example.

Figure 3:
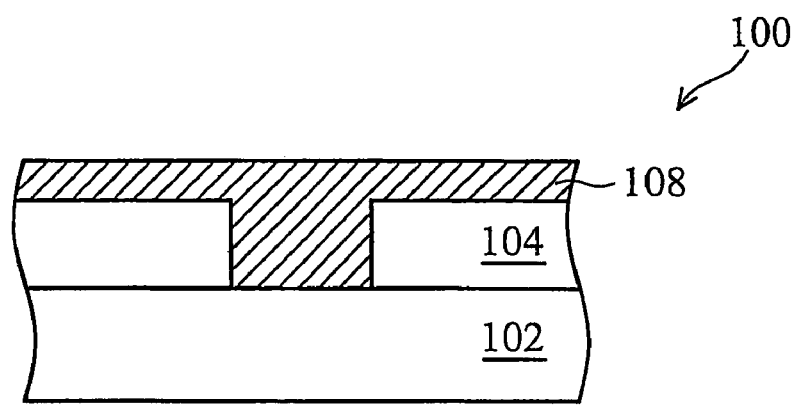

A first conductive material 108 is deposited over the patterned first insulating layer 104 and exposed portions of the workpiece 102, as shown in FIG. 3. The first conductive material 108 preferably comprises a conductive material such as copper, aluminum, silver, tungsten, or combinations thereof. Alternatively, the first conductive material 108 may comprise other conductive materials, for example. As examples, first conductive material 108 may be formed from any of a variety of suitable conducting materials, including (but not limited to): metal nitride, metal alloy, copper, copper alloy, aluminum, aluminum alloy, composites thereof, and combinations thereof.

Figure 4A:
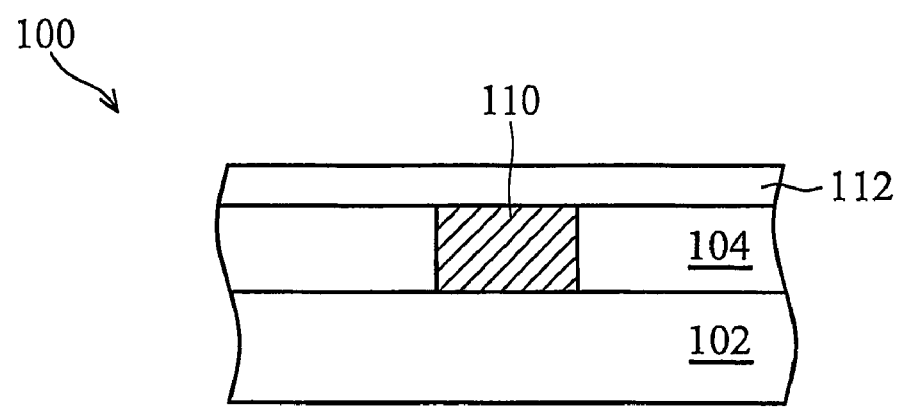

An excess amount of the first conductive material 108 may reside over a top surface of the first insulating layer 104 after the deposition process, as shown in FIG. 3. If present, the excess first conductive material 108 is removed from the top surface of first insulating layer 104, using a chemical mechanical polish (CMP) process, or by an etch process, leaving at least one first conductive line 110 formed within the first insulating layer 104, as shown in FIG. 4a. The at least one first conductive line 110 may comprise a plurality of first conductive lines 110, not shown.

In accordance with a preferred embodiment of the present invention, a first cap layer 112 is deposited or formed over and abutting the at least one first conductive line 110 and also over and abutting a top surface of the first insulating layer 104, as shown in FIG. 4a. The first cap layer 112 preferably provides a blanket coverage, entirely covering the top surfaces of the at least one first conductive line 110 and the first insulating layer 104. The first cap layer 112 in one embodiment preferably comprises a first metal nitride ($MN_y$, wherein M comprises a metal, N is nitrogen, and y is greater than 1), a first metal oxide ($MO_x$), wherein O is oxygen), or a first metal oxynitride ($MO_xN_y$). The first cap layer 112 preferably comprises a non-conductive material, for example, in the case that the at least one first conductive line 110 comprises two or more first conductive lines 110, to prevent shorting of the two or more first conductive lines 110. In one embodiment, the metal M of the first cap layer 112 comprises a refractory metal such as Ta, Ti, W, Ru, Mo, Sc, V, Cr, Ce, Y, In, Al, or Ga.

In one embodiment, the first metal of the cap layer 112 comprises Ta, Sc, Ti, V, Cr, Ce, Y, Mo, Ru, W, In, Al, Ga, or combinations thereof, as an example. In another embodiment, the first cap layer 112 comprises $TaO_xN_y$, $TiOxN_y$, $WO_xN_y$, or $RuO_xN_y$, as examples. Alternatively, the first metal M and the first cap layer 112 may alternatively comprise other metals, for example. Furthermore, the first cap layer 112 may comprise two or more layers of different ones of the suitable materials.

If the first cap layer 112 comprises a first metal nitride $MN_y$, preferably y is greater than 1. In other words, the ratio of N:M is preferably greater than 1:1, or the nitrogen N percentage is greater than the first metal M percentage, by atomic percent. In one embodiment, the first cap layer comprises a resistivity of greater than about $5 \times 10^4$ μohm-cm.

The first cap layer 112 preferably comprises a thickness of about 10 Angstroms to about 600 Angstroms, although alternatively, the first cap layer 112 may comprise other dimensions, for example. In one embodiment, the first cap layer 112 preferably comprises a thickness of about 30 Angstroms.

In one embodiment, the top surface of the at least one first conductive line 110 and the top surface of the first insulating layer 104 may be pretreated using an optional pretreatment process before depositing the first cap layer 112, for example, using $N_2$, $NH_3$, or $H_2$ plasma for less than 1 minute at a temperature of below about 350° C. Alternatively, other pretreatment chemistries and methods may be used, including thermal, plasma or solution treatments, as examples.

The optional pretreatment may be "in situ" or "ex situ", as examples. For example, the workpiece 102 may be pretreated in situ by leaving the workpiece 102 in the processing chamber and pretreating the workpiece 102. Alternatively, the workpiece 102 may be pretreated ex situ by moving the workpiece 102 to a separate processing chamber or tool for the pretreatment process, and then returning the workpiece 102 to the processing chamber for the remainder of the manufacturing process.

The first cap layer 112 is preferably deposited using atomic layer deposition (ALD), physical vapor deposition (PVD), chemical vapor deposition (CVD), or an electroless, electrochemical, or chemical solution deposition method, as examples, although alternatively, the first cap layer 112 may be deposited by other methods.

The manufacturing processes may then be continued to complete the manufacturing of the semiconductor device 100 (not shown in FIG. 4a). As examples, the first cap layer 112 may be patterned to expose a top surface of the at least one first conductive line 110, so that electrical connection may be made to the at least one first conductive line 110 in a subsequently-deposited via layer, interconnect layer, or contact pad layer.

Figure 4B:
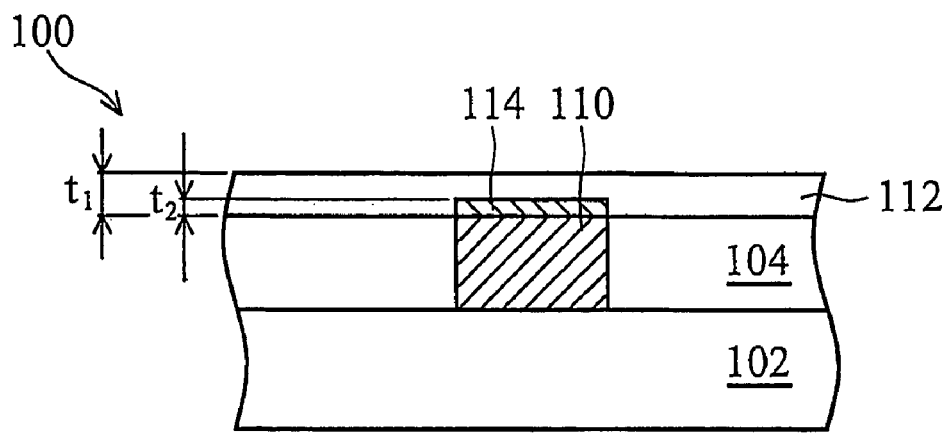

In accordance with one embodiment of the present invention, a first interface region 114 may be formed within the first cap layer 112 upon in the initial stage of the deposition or formation of the first cap layer 112 on said first conductive line, as shown in FIG. 4b. The first interface region 114 may be formed by an appropriate material selection and by the particular temperatures and deposition conditions used to deposit the first cap layer 112. For example, ALD may be used with a metal precursor, with a $NH_3$ gas soak first, at a temperature of about 200 to 350 degrees C.

The first interface region 114 preferably comprises the metal M within the first cap layer 112. The thickness $t_2$ of the first interface region 114 preferably comprises a thickness substantially equal to about ⅓ $t_1$ or less, wherein $t_1$ is the thickness of the first cap layer 112. The first interface region 114 may form a metal to metal adhesion at the top surface of the at least one first conductive line 110 in one embodiment. The first interface region 114 may comprise the first metal M of the first cap layer 112 in a near-pure metal or conductive phase in one embodiment of the invention. In another embodiment, the first interface region 114 is non-conductive and may have a resistivity of greater than about $5 \times 10^4$ μohm-cm, for example.

Figure 4C:
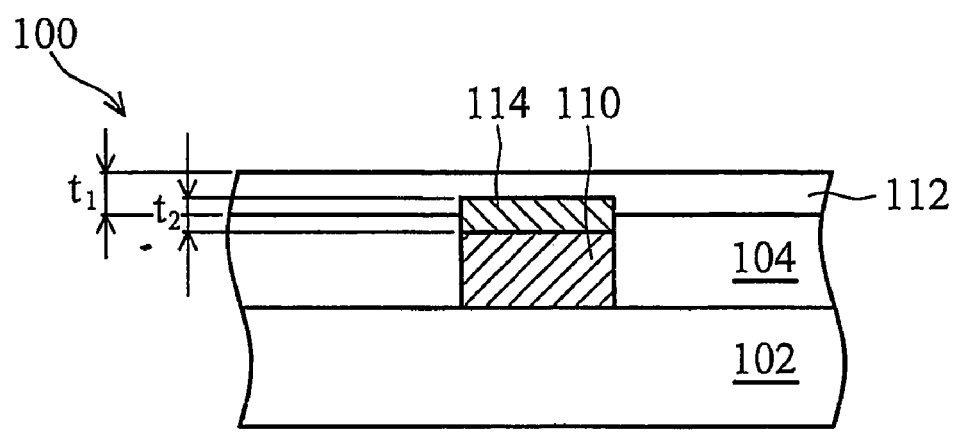

In accordance with one embodiment of the present invention, after the CMP process or etch process to remove excess first conductive material 108 from over the top surface of the first insulating layer 104, the at least one first conductive line 110 may be recessed slightly below the top surface of the first insulating layer 104, as shown in FIG. 4c. For example, the at least one first conductive line 110 may be recessed by a few Angstroms or more below the top surface of the first insulating layer 104. In this embodiment, the optional first interface region 114 formed during the deposition of the first cap layer 112 may be recessed slightly below the top surface of the first insulating layer 104, as shown. If no first interface region 114 is formed, the first cap layer 112 may extend into the recess above the at least one first conductive line 110 (not shown).

Figure 5:
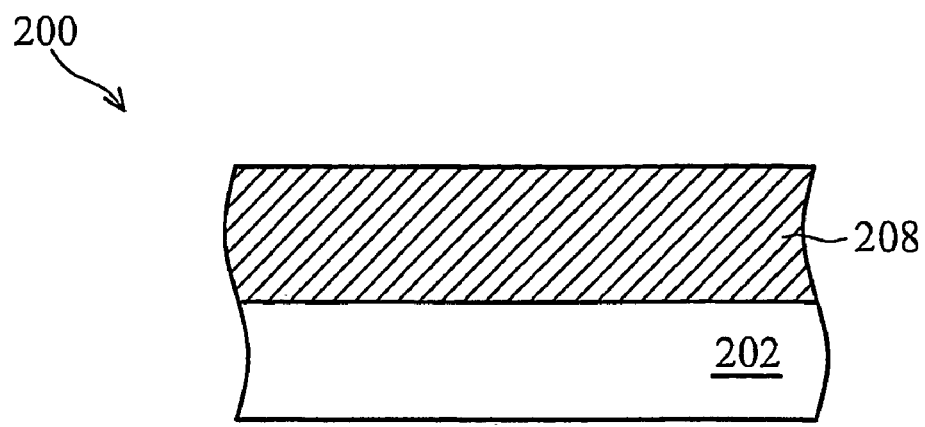
FIGS. 5 through 7 show cross-sectional views of an embodiment of the present invention, wherein the cap layer is over conductive lines formed in a subtractive etch process.
Figure 6:
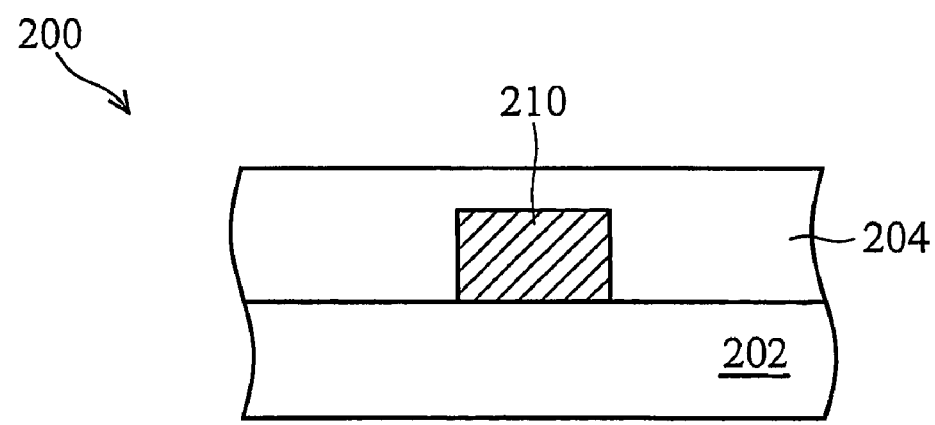
Figure 7:
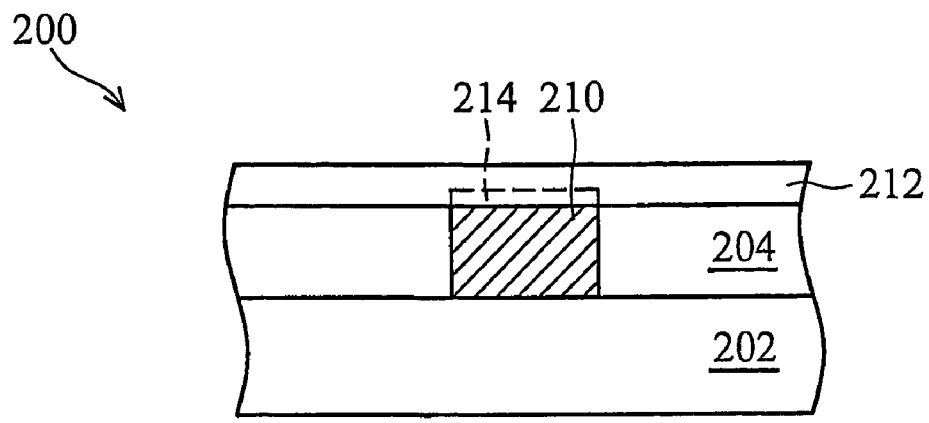

FIGS. 5 through 7 show cross-sectional views of an embodiment of the present invention, wherein the conductive lines are formed in a subtractive etch process. Similar reference numbers are designated for the various elements as were used in FIGS. 1 through 3 and 4a, 4b, and 4c. To avoid repetition, each reference number shown in the figures is not described in detail herein. Rather, similar materials x02, x04, x06, etc . . . are preferably used for the material layers and having the same material properties as were described for FIGS. 1 through 3 and 4a, 4b, and 4c, where x=1 in FIGS. 1 through 4a, 4b, and 4c and x=2 in FIGS. 5 through 7. As an example, the preferred and alternative materials listed for the first insulating layer 104 in the description for FIGS. 1-3, through 4a, 4b, and 4c are preferably also used for first insulating layer 204 in FIGS. 6 and 7.

In the embodiment shown in a cross-sectional view in FIGS. 5 through 7, a subtractive method is used to form the at least one first conductive line 210. For example, if the first conductive line 210 comprises aluminum or an aluminum alloy, a subtractive method is preferably used to form the at least one first conductive line 210. In this embodiment, a first conductive material 208 is deposited over the workpiece 202, as shown in FIG. 5. The first conductive material 208 may be patterned directly or using photolithography, as described above, using a photoresist and a lithography mask. The photoresist may be used as a mask while portions of the first conductive material 208 are etched away, leaving the at least one first conductive line 210 formed over the workpiece 202, as shown in FIG. 6.

A first insulating layer 204 is then deposited over the patterned at least one conductive line 210, as shown in FIG. 6. A CMP process or other etch process is used to remove excess first insulating layer 204 material from over the top surface of the at least one first conductive line 210, as shown in FIG. 7.

A first cap layer 212 is then formed over and abutting the at least one first conductive line 210 and over and abutting the top surface of the first insulating layer 204 in a blanket deposition process, also shown in FIG. 7. As described with reference to the embodiments shown in FIGS. 1 through 3 and 4a, 4b, and 4c, an optional first interface region 214 (shown in phantom) comprising a metal of the first cap layer 212 in a conductive or non-conductive state may be formed within the first cap layer 212.

Figure 8:
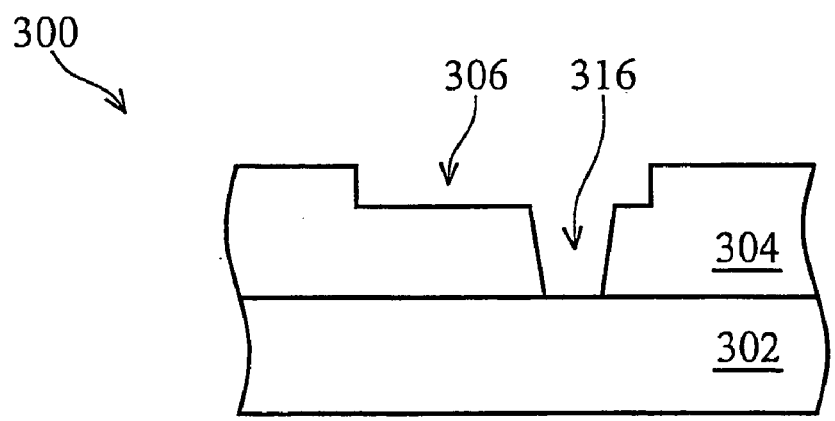
FIGS. 8 and 9 show cross-sectional views of the cap layer in accordance with a preferred embodiment of the present invention implemented in a dual damascene manufacturing process for forming conductive lines.
Figure 9:
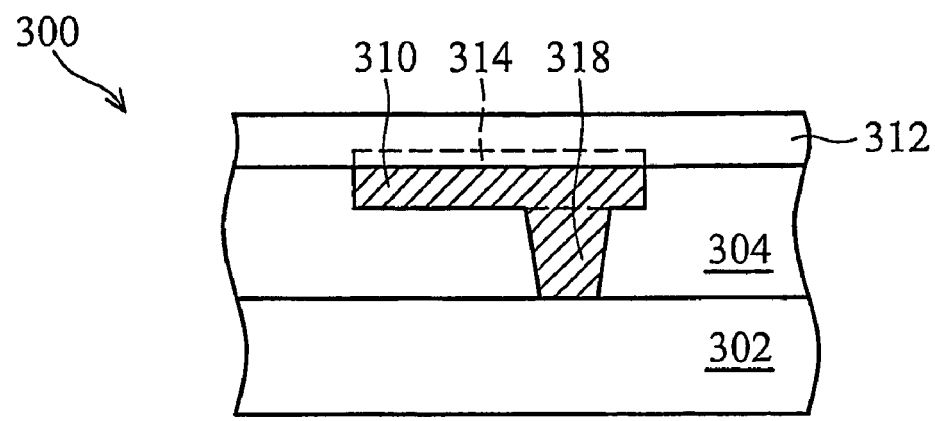

The novel cap layer 112 and 212 of the present invention may also be used in dual damascene structures, as shown in a cross-sectional view in FIGS. 8 and 9 at 312. Again, like reference numbers are designated for the various elements as were used in FIGS. 1-3 and 4a, 4b, and 4c, and FIGS. 5-7. To avoid repetition, each reference number shown in the figures is not described in detail herein. Rather, similar materials x02, x04, x06, etc . . . are preferably used for the material layers shown as were described for FIGS. 1-3 and 4a, 4b, and 4c, where x=1 in FIGS. 1-3, 4a, 4b, and 4c, x=2 in FIGS. 5-7, and x=3 in FIGS. 8 and 9.

In a dual damascene process, first, a first insulating layer 304 is deposited over a workpiece 302, as shown in FIG. 8. The first insulating layer 304 may comprise a thickness of greater than about 3500 Angstroms, for example, although alternatively, the first insulating layer 304 may comprise other dimensions.

In this embodiment, the first insulating layer 304 preferably comprises a thickness greater than the thickness of first insulating layers 204 and 104 as described with reference to previous embodiments described herein, because two patterns will be formed within the first insulating layer 304. For example, the first insulating layer 304 may be patterned with a pattern 306 for at least one first conductive line, and also with a pattern 316 for vias residing beneath at least one of the first conductive line patterns 306, as shown.

A first conductive material is deposited over the first insulating layer 304 to fill the first conductive line pattern 306 and the via pattern 316 and form at least one first conductive line 310 and a first via 318 over the at least one conductive line 310, as shown in FIG. 9. Excess conductive material is removed from over the top surface of the first insulating layer 304.

A first cap layer 312 is then deposited over the first insulating layer 304 and the at least one first conductive line 310, as shown in FIG. 9. The first cap layer 312 acts as a diffusion barrier for the metal of the at least one first conductive line 310, and also may function as an etch stop layer. An optional first interface region 314 (shown in phantom) comprising the metal of the first cap layer 312 in a conductive or non-conductive phase may be formed within the first cap layer 312 over and abutting the top surface of the at least one first conductive line 310.

Figure 10:
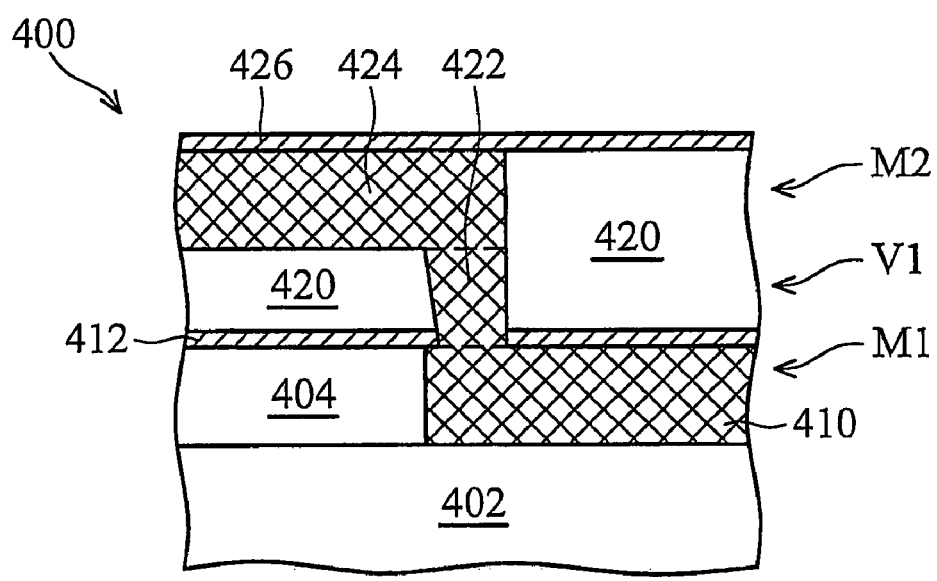
FIG. 10 shows a cross-sectional view of an embodiment of the present invention, wherein a first cap layer is formed over first conductive lines and a second cap layer is formed over second conductive lines in a multi-layer interconnect of a semiconductor device, in accordance with an embodiment of the present invention.

FIG. 10 shows a cross-sectional view of an embodiment of the present invention wherein cap layers 412 and 426 are formed over each metallization layer M2 and M1 of a semiconductor device 400. Again, to avoid repetition, each reference number shown in the diagram is not described in detail herein, but rather, like reference numbers are designated for the various elements as were used in previous figures.

A first cap layer 412 is formed over first conductive lines 410 in metallization layer M1, and a second cap layer 426 is formed over second conductive lines 424 in a multi-layer interconnect region of the semiconductor device 400. Vias 422 in via level V1, and second conductive lines 424 in metallization layer M2 may be formed in second insulating layer 420 using a single or dual damascene process, for example. The first cap layer 412 is patterned over a portion of the at least one first conductive line 410 to allow electrical connection of the via 422 to the underlying first conductive line 410, as shown.

The manufacturing process flow for the semiconductor device 400 will next be described. The at least one first conductive line 410 is formed within a first insulating layer 404, in a first metallization layer M1 of the semiconductor device 400. A first cap layer 412 is formed over the first insulating layer 404 and also over the at least one first conductive line 410.

After patterning the first cap layer 412 to expose a portion of the at least one first conductive line 410, a second insulating layer 420 is deposited or formed over the first cap layer 412. The second insulating layer 420 preferably comprises the same materials as were described for the first insulating layer 104 in FIGS. 4a, 4b, and 4c, as examples. The second insulating layer 420 is patterned with a pattern for at least one second conductive line and at least one via beneath the at least one second conductive line. In one embodiment, for example, the first cap layer 412 may be patterned during the patterning of the second insulating layer 420, e.g., during the patterning of the via 422 pattern.

A second conductive material is then deposited over the second insulating layer 420 to fill the via pattern and the at least one second conductive line pattern, forming a first via 422 in the via metallization layer V1, and simultaneously forming at least one second conductive line 424 in the second metallization layer M2 of the semiconductor device 400. The second conductive material preferably comprises the same materials as were described for the first conductive line 110 in FIGS. 4a, 4b, and 4c, as examples. Excess second conductive material is then removed from the top surface of the second insulating layer 420 using a CMP process or an etch process, forming at least one second conductive line 424 and at least one via 422, as shown.

In accordance with embodiments of the present invention, a second cap layer 426 is formed over the at least one second conductive line 424 and the exposed top surface of the second insulating layer 420, as shown in FIG. 10. The second cap layer 426 preferably comprises the same materials and has the similar material properties as were described for the first cap layer 112 in FIGS. 4a, 4b, and 4c, as examples. Multiple additional insulating layers and conductive lines and vias may be formed in a similar fashion, with a cap layer 412 and 426 as described herein being over the top surface of at least one of the metallization layers to prevent diffusion of the metal in the conductive lines upward into the next adjacent insulating layer.

While not shown in FIG. 10, an interface region may be formed within the first cap layer 412, the second cap layer 426, or both, adjacent the underlying at least one conductive line 410 and 424, respectively. The interface regions may be conductive or non-conductive, and preferably comprise a metal of the first cap layer 412 and second cap layer 426. In one embodiment, the interface regions comprise a resistivity of greater than about $5 \times 10^4$ μohm-cm, as an example.

Figure 11:
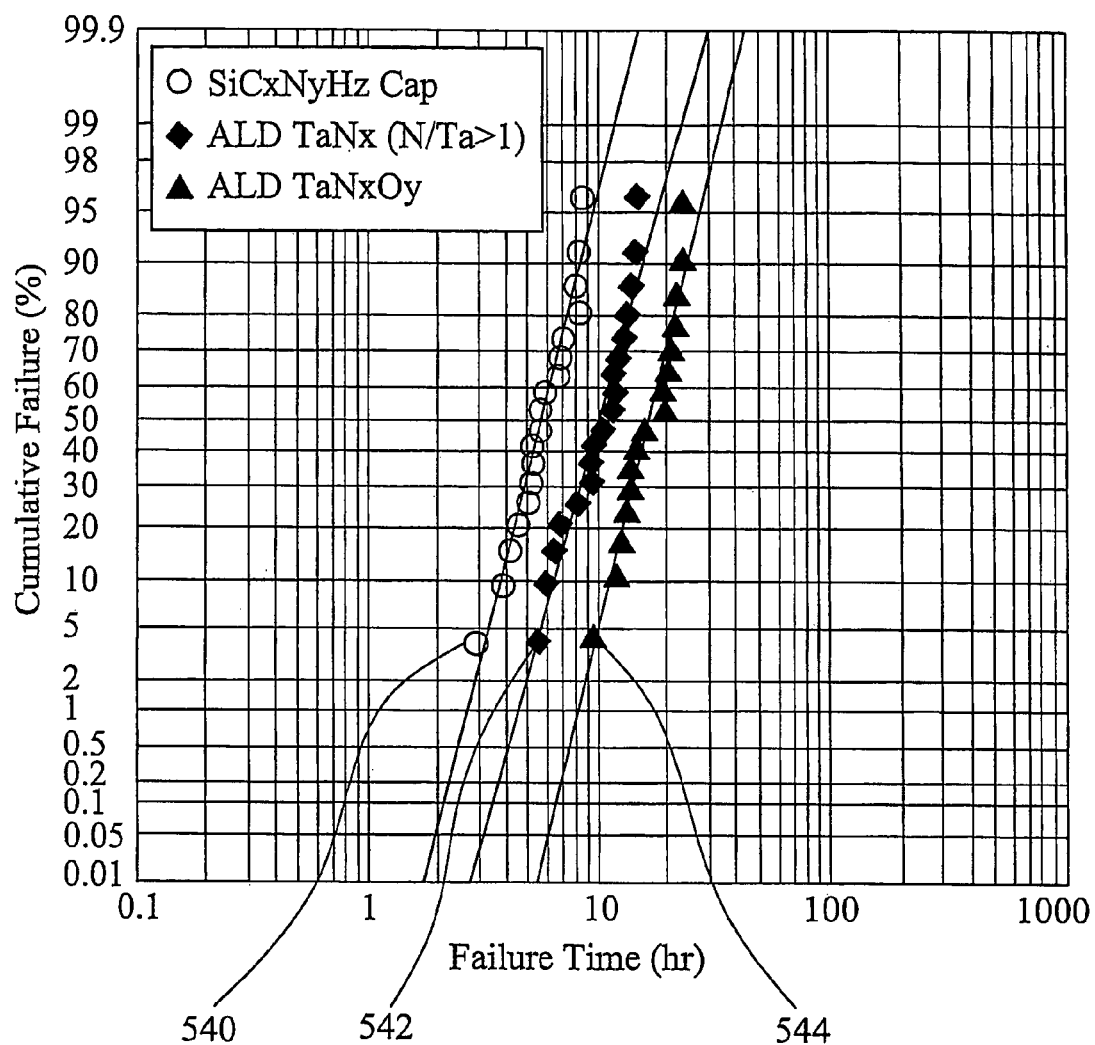
FIGS. 11 and 12 show graphs of experimental test results of utilizing the cap layers of embodiments of the present invention, compared to prior art cap layers.
Figure 12:
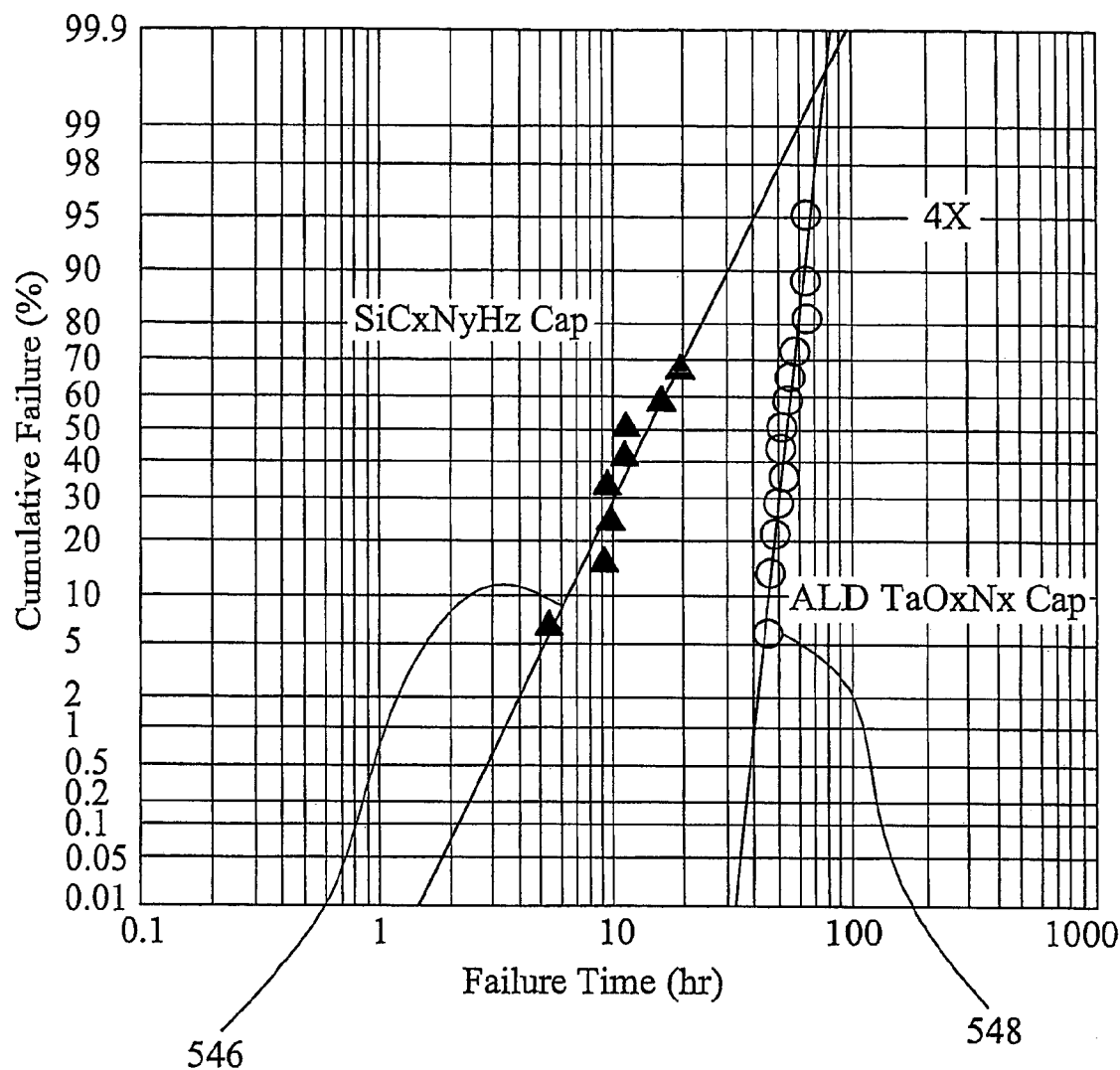

Experimental results show that the cap layers comprising an oxide of a metal, a nitride of a metal, or an oxynitride of a metal as described for embodiments of the invention herein produce a robust metallization structure with increased failure times (e.g., the devices take longer to fail under stress tests), and thus result in longer life for semiconductor devices. FIGS. 11 and 12 show graphs indicating test results of utilizing cap layers in accordance with embodiments of the present invention, compared to a prior art cap layer comprised of $SiC_xN_yH_z$.

FIG. 11 shows a graph of cumulative failures over time for a cap layer of $SiC_xN_yH_z$ at 540, a non-conductive cap layer comprising $TaN_x$, wherein N:Ta>1, deposited by ALD, in accordance with an embodiment of the invention at 542, and a cap layer comprising $TaN_xO_y$ deposited by ALD in accordance with another embodiment of the invention at 544. The experiments were performed with copper conductive lines and a dielectric material comprising Black Diamond™. $TaN_x$ performed better than $SiC_xN_yH_z$ as a cap layer, and the $TaN_xO_y$ performed better than $TaN_x$ or $SiC_xN_yH_z$. Table 1 shows more details of the experimental test results shown in the graph of FIG. 11.

TABLE 1

| Approach | Conventional $SiC_xN_yH_z$ cap 1 | ALD $TaN_x$ | ALD $TaN_xO_y$ |
|---|---|---|---|
| MTTF (Mean Time to Failure, hrs) | 5.7 | 10.06 | 16.74 |
| $J_{max}(A/cm^2)$ | 5.74E+05 | 9.11E+05 | 1.74E+06 |

As can be seen from the experimental results in Table 1, failures of the semiconductor devices occurred earlier in the control group comprising a cap layer of $SiC_xH_yN_z$. Thus, a semiconductor device with an increased lifetime and improved reliability results from embodiments of the present invention. A three-fold improvement was seen in lifetime (mean time to failure (MTTF)) and $J_{max}$, which is the calculated maximum allowed current density at device operation temperature for the $TaN_xO_y$ cap layer, for example.

FIG. 12 shows experimental results comparing a conventional $SiC_xN_yH_z$ cap layer at 546 and an ALD $TaN_xO_y$ cap layer at 548. Copper conductive lines and a low dielectric constant material comprising Orion™ having a dielectric constant of 2.5 were used in the experiments. The $TaN_xO_y$ cap layer of the present invention outperformed the conventional cap layer four-fold in $J_{max}$, as can be seen in the more detailed experimental results shown in Table 2 below.

TABLE 2

| Approach | Conventional $SiC_xN_yH_z$ cap 2 | ALD $TaN_xO_y$ |
|---|---|---|
| MTTF (Mean Time to Failure, hrs) | 14.46 | 56.01 |
| $J_{max}(A/cm^2)$ | 3.88E+05 | 1.59E+06 |

Advantages of preferred embodiments of the present invention include providing a cap layer 112, 212, 312, 412, 426 that suppresses the surface diffusion of copper and other metals used for conductive lines 110, 210, 310, 410, 424 of a semiconductor device 100, 200, 300, 400. The cap layer 112, 212, 312, 412, 426 formation is easily implemented into current manufacturing process flows, and results in high performance and high yield integrated circuit products. The cap layers 112, 212, 312, 412, 426 described herein result in the manufacturing of a robust damascene conductive line structure having improved reliability. The cap layers 112, 212, 312, 412, 426 function as a barrier layer to prevent diffusion of the metal from conductive lines into adjacent insulating material layers, and may also function as an etch stop layer for damascene processes in some applications, for example. The cap layers 112, 212, 312, 412, 426 described herein provide increased electromigration resistance for the conductive lines 110, 210, 310, 410, 424 over which the cap layers are formed. The optional interface regions 114, 214, 314 of the cap layers 112, 212, 312 provide increased robustness for the structure and improve the adhesion of the cap layers 112, 212, 312 to the underlying conductive lines 110, 210, 310.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece;
   forming a first insulating layer over the workpiece;
   forming at least one first conductive line in the first insulating layer;

forming a first cap layer over the first insulating layer and the at least one first conductive line, wherein forming the first cap layer comprises forming nonconductive material comprised of at least a first metal element;

forming at least one second insulating layer over the first cap layer;

forming at least one second conductive line in the at least one second insulating layer; and forming at least one second cap layer over at least one second insulating layer and at least one second conductive line, wherein the at least one second cap layer is nonconductive and comprises at least a second metal element.

2. The method according to claim 1, wherein the at least one second cap layer comprises a second metal nitride MNy, wherein Ni is the second metal element, N is nitrogen, and y is greater than 1.

3. The method according claim 1, wherein the at least one second cap layer comprises a second metal oxide.

4. The method according claim 1, wherein the at least one second cap layer comprises a second metal oxy-nitride.

5. The method according to claim 1, wherein forming the at least one second cap layer comprises forming the at least a second metal element comprising Ta.

6. The method according to claim 1, wherein forming the at least one second cap layer comprises forming the at least a second metal element comprising Ru.

7. The method according to claim 1, wherein forming the at least one second cap layer comprises forming the at least a second metal element from a material selected from the group consisting essentially of Sc, Ti, V, Cr, Ce, Y, Mo, W, In, Al, and Ga.

8. The method according to claim 1, wherein forming the at least one second cap layer comprises forming the at least a second metal element comprising the at least a first metal element.

9. The method according to claim 1, wherein forming the at least one second cap layer comprises forming at least one second cap layer comprising a thickness of about 10 Angstroms to about 600 Angstroms.

10. The method according to claim 1, wherein forming the at least one second cap layer comprises forming a second interface region over the at least one second conductive line, wherein the second interface region comprises the at least a second metal element of the at least one second cap layer in a conductive phase.

11. The method according to claim 1, wherein forming the at least one second cap layer comprises forming a second interface region over the at least one second conductive line, wherein the second interface region comprises the at least a second metal element of the at least one second cap layer in a non-conductive phase having resistivity greater than about $5 \times 10^4$ μohm-cm.

12. The method according to claim 1, wherein fanning the at least one second cap layer comprises forming a second interface region over the at Least one second conductive line, wherein the second interface region comprises the at least a second metal element of the at least one second cap layer having resistivity greater than about $5 \times 10^4$ μohm-cm.

13. The method according to claim 12, wherein forming the at least one second cap layer comprises forming the at least one second cap layer having a first thickness, wherein forming the second interface region comprises forming the second interface region having a second thickness, wherein the second thickness is substantially about ⅓ the first thickness or less.

* * * * *

UNITED STATES PATENT AND TRADEMARK OFFICE
CERTIFICATE OF CORRECTION

PATENT NO. : 7,253,501 B2 Page 1 of 1
APPLICATION NO. : 10/909980
DATED : August 7, 2007
INVENTOR(S) : Lee et al.

It is certified that error appears in the above-identified patent and that said Letters Patent is hereby corrected as shown below:

In Col. 11 line 3, delete "forming" and insert --forming a--.
In Col. 11 line 16, delete "Ni" and insert --M--.
In Col. 11 line 21, delete "oxy-nitride" and insert --oxynitride--.
In Col. 12 line 20, delete "fanning" and insert --forming--.
In Col. 12 line 22, delete "Least" and insert --least--.

Signed and Sealed this

Sixth Day of November, 2007

JON W. DUDAS
*Director of the United States Patent and Trademark Office*